United States Patent
Khwa et al.

(10) Patent No.: US 10,008,275 B1
(45) Date of Patent: Jun. 26, 2018

(54) CONTROL METHOD FOR SOLID STATE STORAGE DEVICE

(71) Applicants: Lite-On Electronics (Guangzhou) Limited, Guangzhou (CN); LITE-ON TECHNOLOGY CORPORATION, Taipei (TW)

(72) Inventors: Win-San Khwa, Taipei (TW); Meng-Fan Chang, Taipei (TW); Jen-Chien Fu, Taipei (TW); Shuai-Fan Chen, Taipei (TW)

(73) Assignees: LITE-ON ELECTRONICS (GUANGZHOU) LIMITED, Guangzhou (CN); LITE-ON TECHNOLOGY CORPORATION, Taipei (TW)

( * ) Notice: Subject to any disclaimer, the term of this patent is extended or adjusted under 35 U.S.C. 154(b) by 0 days. days.

(21) Appl. No.: 15/649,777

(22) Filed: Jul. 14, 2017

(30) Foreign Application Priority Data

May 24, 2017 (CN) .......................... 2017 1 0375139

(51) Int. Cl.
*G11C 7/00* (2006.01)
*G11C 16/34* (2006.01)
*G11C 16/26* (2006.01)
*G11C 16/32* (2006.01)

(52) U.S. Cl.
CPC .......... *G11C 16/3431* (2013.01); *G11C 16/26* (2013.01); *G11C 16/32* (2013.01)

(58) Field of Classification Search
CPC ............ G11C 11/406; G11C 11/40615; G11C 2211/4061; G11C 11/40618; G11C 2211/4067
USPC .......................................... 365/222, 201, 236
See application file for complete search history.

(56) References Cited

U.S. PATENT DOCUMENTS

| | | | |
|---|---|---|---|
| 2016/0163393 A1* | 6/2016 | Liang | G11C 16/349 365/185.12 |
| 2016/0335029 A1* | 11/2016 | Goto | G06F 3/0659 |

OTHER PUBLICATIONS

Atsuro Kobayashi; et al, "Versatile TLC NAND Flash Memory Control to Reduce Read Disturb Errors by 85% and Extend Read Cycles by 6.7-times of Read-Hot and Cold Data for Cloud Data Centers", Symposium on VLSI Circuits Digest of Technical Papers, 2016, IEEE.

* cited by examiner

*Primary Examiner* — Son Dinh
(74) *Attorney, Agent, or Firm* — WPAT, PC

(57) ABSTRACT

A control method for a solid state storage device is provided. Firstly, an elapsed time period of the solid state storage device is counted when the solid state storage device is in a normal working state. Then, a read refresh operation is performed on a memory array of the solid state storage device at a first time interval.

12 Claims, 6 Drawing Sheets

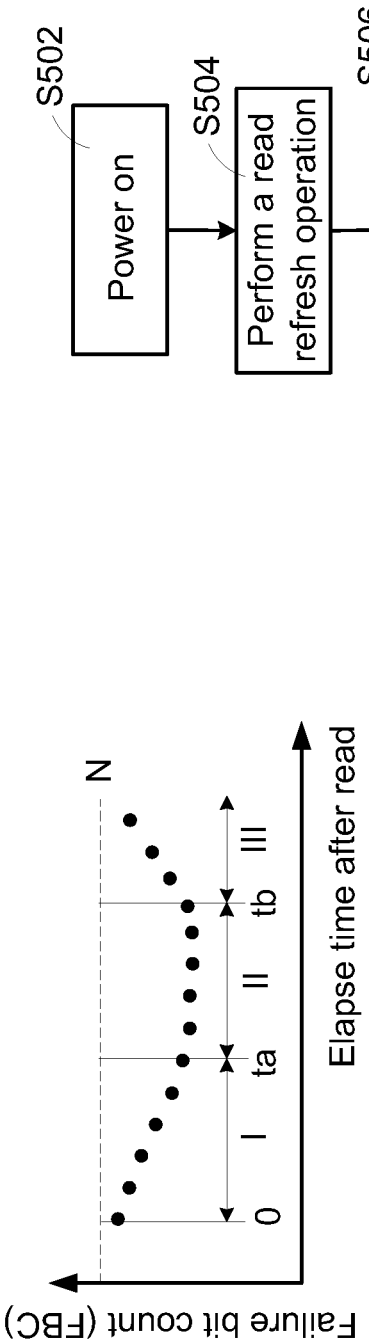
FIG. 4
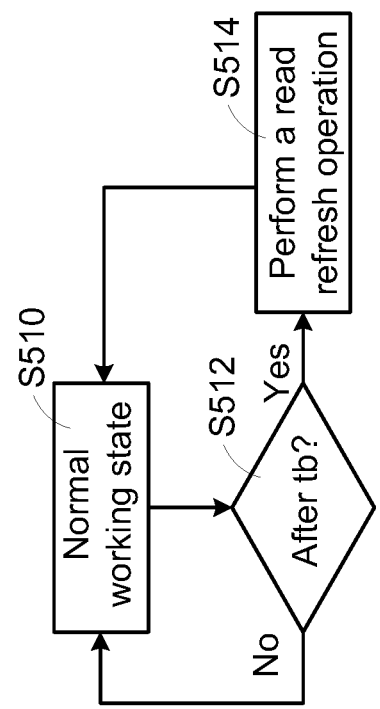
FIG. 5B
FIG. 5A

CONTROL METHOD FOR SOLID STATE STORAGE DEVICE

This application claims the benefit of People's Republic of China Patent Application No. 201710375139.8, filed May 24, 2017, the subject matter of which is incorporated herein by reference.

FIELD OF THE INVENTION

The present invention relates to a control method for a solid state storage device, and more particularly to a method of controlling a read refresh operation and a method of controlling a stored data for a solid state storage device.

BACKGROUND OF THE INVENTION

As is well known, solid state storage devices such as SD cards or solid state drives (SSD) are widely used in various electronic devices.

FIG. 1 is a schematic functional block diagram illustrating a conventional solid state storage device. As shown in FIG. 1, the solid state storage device 10 comprises an interface controller 101 and a non-volatile memory 105. The non-volatile memory 105 further comprises a memory array 109 and an array control circuit 111. The memory array 109 comprises plural memory cells.

The solid state storage device 10 is connected with a host 14 through an external bus 12. Generally, the external bus 12 is a USB bus, an SATA bus, a PCIe bus, or the like. Moreover, the interface controller 101 is connected with the non-volatile memory 105 through an internal bus 113. According to a write command from the host 14, the interface controller 101 controls the array control circuit 111 to store the write data from the host 14 to the non-volatile memory 105. Alternatively, according to a read command from the host 14, the interface controller 101 controls the array control circuit 111 to acquire a read data from the non-volatile memory 105. In addition, the read data is transmitted to the host 14 through the interface controller 101.

Depending on the data amount to be stored in the memory cell, the memory cells may be classified into three types, i.e. a single-level cell (SLC), a multi-level cell (MLC) and a triple-level cell (TLC). The SLC can store only one bit of data per cell. The MLC can store two bits of data per cell. The TLC can store three bits of data per cell.

In the memory array 109, each memory cell comprises a floating gate transistor. By adjusting the number of hot carriers injected into a floating gate of the floating gate transistor, the array control circuit 111 controls the storing state of the floating gate transistor. In other words, the floating gate transistor of each SLC has two storing states, the floating gate transistor of each MLC has four storing states, and the floating gate transistor of each TLC has eight storing states.

Moreover, the floating gate of the floating gate transistor of each memory cell can store hot carriers. A threshold voltage (Vth) of the floating gate transistor is determined according to the amount of the stored hot carriers. If a floating gate transistor has a higher threshold voltage, it means that a higher gate voltage is required to turn on the floating gate transistor. Whereas, if a floating gate transistor has a lower threshold voltage, it means that the floating gate transistor can be turned on by a lower gate voltage.

During a program cycle of the solid state storage device, the interface controller 101 controls the array control circuit 111 to change the amount of the hot carriers to be injected into the floating gate. Consequently, the threshold voltage of the floating gate transistor is correspondingly changed. During a read cycle, the array control circuit 111 provides a read voltage to the floating gate transistor, and determines the storing state of the floating gate transistor by judging whether the floating gate transistor is turned on.

FIG. 2 schematically illustrates the threshold voltage distribution curves of triple-level cells in different storing states. According to the number of injected hot carriers, the triple-level cell has eight storing states "Erase" and "A"~"G". Before the hot carriers are injected into the memory cell, the memory cell is in a storing state "Erase". As the number of the injected hot carriers increases, the memory cell is sequentially in the other seven storing states "A"~"G". For example, the memory cell in the storing state "G" has the highest threshold voltage, and the memory cell in the storing state "Erase" has the lowest threshold voltage. After an erase cycle, the memory cell is restored to the storing state "Erase", and no hot carriers are retained in the memory cell.

In practice, even if many memory cells are in the same storing state during the program cycle, the threshold voltages of these memory cells are not all identical. That is, the threshold voltages of these memory cells are distributed in a specified distribution curve with a median threshold voltage. The median threshold voltage of the memory cells in the storing state "Erase" is Ver. The median threshold voltage of the memory cells in the storing state "A" is Va. The median threshold voltage of the memory cells in the storing state "B" is Vb. The median threshold voltage of the memory cells in the storing state "C" is Vc. The median threshold voltage of the memory cells in the storing state "D" is Vd. The median threshold voltage of the memory cells in the storing state "E" is Ve. The median threshold voltage of the memory cells in the storing state "F" is Vf. The median threshold voltage of the memory cells in the storing state "G" is Vg. For example, the median threshold voltage for a greater number of memory cells in the storing state "A" is Va.

Please refer to FIG. 2 again. According to the above characteristics of the triple-level cell, a read voltage set including seven read voltages Vra~Vrg is defined. During the read cycle, the array control circuit 111 sequentially provides the seven read voltages of the read voltage set to the memory array 109 in order to detect the storing states of the triple-level cells.

The storing states of the triple-level cells are determined according to the read voltages Vra~Vrg. For example, the read voltage Vrg is provided from the array control circuit 111 to the memory array 109. If the threshold voltage of the memory cell is higher than the read voltage Vrg and the memory cell is not turned on, the array control circuit 111 judges that the memory cell is in the storing state "G". Whereas, if the threshold voltage of the memory cell is lower than the read voltage Vrg and the memory cell is turned on, the array control circuit 111 judges that the memory cell is not in the storing state "G".

As the production process of the flash memory gradually advances, the memory array 109 with a 3D configuration has been introduced into the market. For example, the memory array 109 is a 3D NAND flash memory. The memory array with the 3D configuration can effectively reduce the cost per bit and possess high storage capability.

In comparison with the memory array with the 2D configuration, the structure and characteristic of the memory array with the 3D configuration are distinguished. Consequently, if the memory array 109 with the 3D configuration has accessing error, the conventional method for solving the memory array with the 2D configuration cannot be applied to the memory array 109 with the 3D configuration.

FIGS. 3A and 3B schematically illustrate the changes of the threshold voltage distribution curves of read-hot data and read-cold data for the memory array with the 3D configuration. For example, the related technology is disclosed in a 2016 IEEE Symposium on VLSI Circuits, Honolulu, Hi., 2016, pp. 1-2, DOI: 10.1109NLSIC.2016.7573505.

Generally, the stored data of the frequently-read memory cells are referred as read-hot data, and the stored data of the seldom-read memory cells are referred as read-cold data.

Please refer to FIG. 3A. As the reading cycle of the read-hot data increases, the threshold voltage distribution curves are shifted in two different directions. For example, as the reading cycle of the read-hot data increases, the threshold voltage distribution curves corresponding to the storing states "A", "B", "C", "D" and "E" are shifted in the positive direction. That is, the threshold voltages of the memory cells increase. Whereas, as the reading cycle of the read-hot data increases, the threshold voltage distribution curves corresponding to the storing states "F" and "G" are shifted in the negative direction. That is, the threshold voltages of the memory cells decrease. Moreover, as the reading cycle of the read-hot data increases, the threshold voltage distribution curve corresponding to the storing state "Erase" is also shifted in the positive direction.

Please refer to FIG. 3B. As the time period of storing the read-cold data increases, the threshold voltage distribution curves are shifted in the same direction. For example, as the time period of storing the read-cold data increases, the threshold voltage distribution curves corresponding to the storing states "A"~"G" are shifted in the negative direction. That is, the threshold voltages of the memory cells decrease. Similarly, as the time period of storing the read-cold data increases, the threshold voltage distribution curve corresponding to the storing state "Erase" is also shifted in the negative direction.

SUMMARY OF THE INVENTION

An embodiment of the present invention provides a control method for a solid state storage device. Firstly, an elapsed time period of the solid state storage device is counted when the solid state storage device is in a normal working state. Then, a read refresh operation is performed on a memory array of the solid state storage device at a first time interval.

Another embodiment of the present invention provides a control method for a solid state storage device. Firstly, a read command from a host is executed to read a read data from plural memory cells of a specified region of a memory array when the solid state storage device is in a normal working state. Then, an error correction is performed to realize a failure bit count of the read data in a specified storing state. If the failure bit count is larger than a first value, a real refresh operation is performed on the memory cells of the specified region.

A further embodiment of the present invention provides a control method for a solid state storage device. Firstly, a read command from a host is executed to read a read data from plural memory cells of a specified region of a memory array when the solid state storage device is in a normal working state. Then, an error correction is performed to realize a failure bit count of the read data in a specified storing state. If the failure bit count is larger than a first value, it is judged that the memory cells of the specified region store read-hot data. If the failure bit count is not larger than the first value, it is judged that the memory cells of the specified region store read-cold data.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 4 is a plot illustrating the relationship between the failure bit count (FBC) of the memory array and the elapse time after read;

FIG. 5A is a flowchart illustrating a control method for a solid state storage device according to a first embodiment of the present invention;

FIG. 5B is a flowchart illustrating a control method for a solid state storage device according to a second embodiment of the present invention;

DETAILED DESCRIPTION OF PREFERRED EMBODIMENTS

Figure 1:
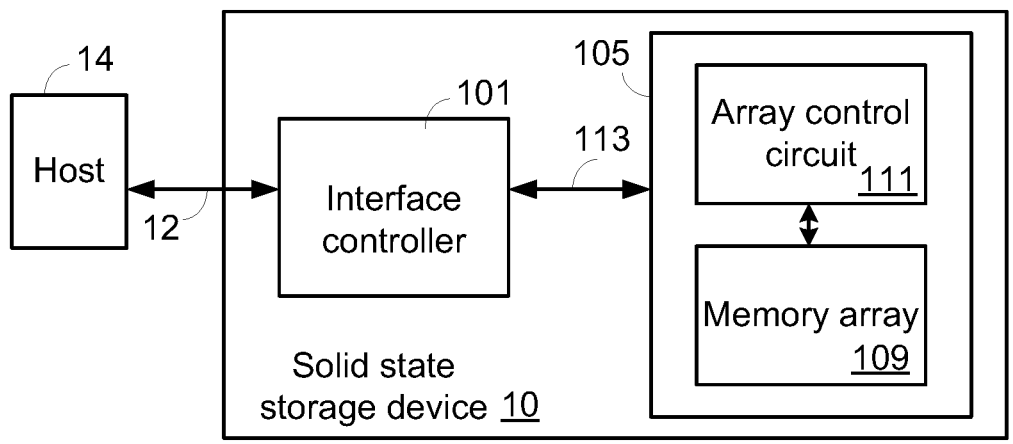
FIG. 1 (prior art) is a schematic functional block diagram illustrating a conventional solid state storage device.

The present invention provides a control method for a solid state storage device. The architecture of the solid state storage device is similar to that of FIG. 1. That is, the solid state storage device also comprises an interface controller 101 and a non-volatile memory 105. The non-volatile memory 105 comprises a memory array 109 and an array control circuit 111.

FIG. 4 is a plot illustrating the relationship between the failure bit count (FBC) of the memory array and the elapse time after read. In this embodiment, the memory array 109 has a 3D configuration. The time point of performing the read action and the failure bit count are in a specified relationship.

Please refer to FIG. 4. At t=0, a read action has been performed on the memory cells of a specified region of the memory array 109. If another read action is performed on the memory cells of the specified region of the memory array 109 at a time point before and away from ta, the failure bit count is larger. Whereas, if another read action is performed on the memory cells of the specified region of the memory array 109 at a time point before and near ta, the failure bit count is lower. That is, the data error rate gradually decreases in the zone I.

As shown in FIG. 4, the failure bit count in the time period between ta and tb is lower than the failure bit count at the time point ta. That is, the data error rate in the zone II is the lowest. Under this circumstance, an error correction unit (ECC unit) of the interface controller 101 can easily correct the error and accurately acquire the read data.

If another read action is performed on the memory cells of the specified region at a time point after tb, the failure bit count gradually increases. That is, the date error rate gradually increases in the zone III. If the failure bit count is larger than a threshold value N with the long elapsed time, the ECC unit of the interface controller 101 cannot easily correct the error and accurately acquire the read data.

In an embodiment, the time point ta is about 100 ms, and the time point tb is about 3 minutes. That is, if another read action is performed on the memory cells of the specified region of the 3D memory array 109 after the previous read action has been performed for a time period shorter than 100 ms, the failure bit count is larger. Whereas, if another read action is performed on the memory cells of the specified region of the 3D memory array 109 after the previous read action has been performed for a time period between 100 ms and 3 minutes, the failure bit count is smaller. Whereas, if a read action is performed on the memory cells of the specified region of the 3D memory array 109 after the previous read action has been performed for a time period longer than 3 minutes, the failure bit count gradually increases.

According to the above characteristics, the present invention provides a control method for a solid state storage device with a 3D memory array.

FIG. 5A is a flowchart illustrating a control method for a solid state storage device according to a first embodiment of the present invention. When the solid state storage device 10 is in the normal working state, the solid state storage device 10 can receives a command from the host 14.

After the solid state storage device 10 is in a normal working state (Step S510), a step S512 is performed to judge whether the solid state storage device 10 has been in the normal working state for a time interval tb.

If the judging condition of the step S512 is satisfied, a read refresh operation is performed on the memory array 109 (Step S514). Then, the steps S510 and S512 are repeatedly done to judge whether the solid state storage device 10 has been in the normal working state for the time interval tb.

For example, tb is 3 minutes. When the solid state storage device 10 is in the normal working state, the interface controller 101 periodically performs the read refresh operation on the non-volatile memory 105 at an interval of 3 minutes.

In accordance with the present invention, the read refresh operation is a dummy read action. When the array control circuit 111 receives a read refresh command, the array control circuit 111 performs a read action on the memory array 109. Meanwhile, the interface controller 101 doesn't care the read data from the memory array 109. That is, the interface controller 101 does not do any action (e.g., error correction) according to the read data from the memory array 109. While the read refresh operation is performed, the read action is performed on the memory array 109 according to the read voltage set. That is, the purpose of the read refresh operation is not to receive the read data from the memory array 109.

As mentioned above, the failure bit count is smaller than a specified number N after a read action has been performed for a time period shorter than 3 minutes. In accordance with the control method of the present invention, the failure bit count of the memory array 109 is maintained to be smaller than the specified number N. In response to a true read command from the solid state storage device 10, the error correction unit of the interface controller 101 can easily correct the error of the read data from the memory array 109. Consequently, the accuracy of the read data is enhanced.

FIG. 5B is a flowchart illustrating a control method for a solid state storage device according to a second embodiment of the present invention. In comparison with the first embodiment, the control method of this embodiment further comprises an initialization process after the solid state storage device 10 is boosted. The initialization process comprises steps S502, S504 and S506. The other steps of the control method of this embodiment are identical to those of the first embodiment, and are not redundantly described herein.

Generally, the time length of the solid state storage device 10 in the power-off state cannot be realized. For allowing the solid state storage device 10 to accurately output the read data, the following steps are performed after the solid state storage device 10 is powered on. After the solid state storage device 10 is powered on (Step S502), a read refresh operation is performed on the memory array 109 (Step S504). After a time interval ta elapses (Step S506), the solid state storage device 10 is in the normal working state (Step S510). For example, ta is 100 ms.

The steps S502, S504 and S506 can increase the accuracy of the read data after the solid state storage device 10 is powered on and before the solid state storage device 10 is in the normal working state. After the solid state storage device 10 is in the normal working state, the steps S510, S512 and S514 can increase the accuracy of the read data.

However, the control method of the first embodiment and the control method of the second embodiment still have some drawbacks. For example, since the memory cells are frequently subjected to the read refresh operation, the stored data of the memory cells become read-hot data. As mentioned above in FIG. 3A, the threshold voltage distribution curves are shifted. Under this circumstance, the accuracy of the read data is impaired.

For example, after the solid state storage device 10 has been powered on for 5 hours, the memory array 109 has been subjected to the read refresh operation 100 times (i.e., 100 cycles). Since the threshold voltage distribution curves corresponding to various storing states of the memory cells are shifted, the accuracy of the read data is impaired.

Figure 3A:
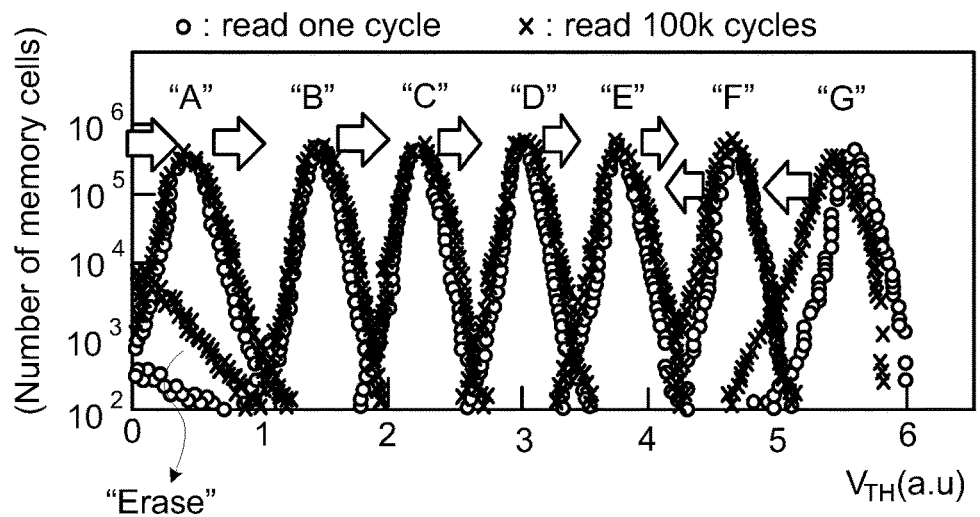
FIGS. 3A and 3B (prior art) schematically illustrate the changes of the threshold voltage distribution curves of read-hot data and read-cold data for the memory array with the 3D configuration.
Figure 3B:
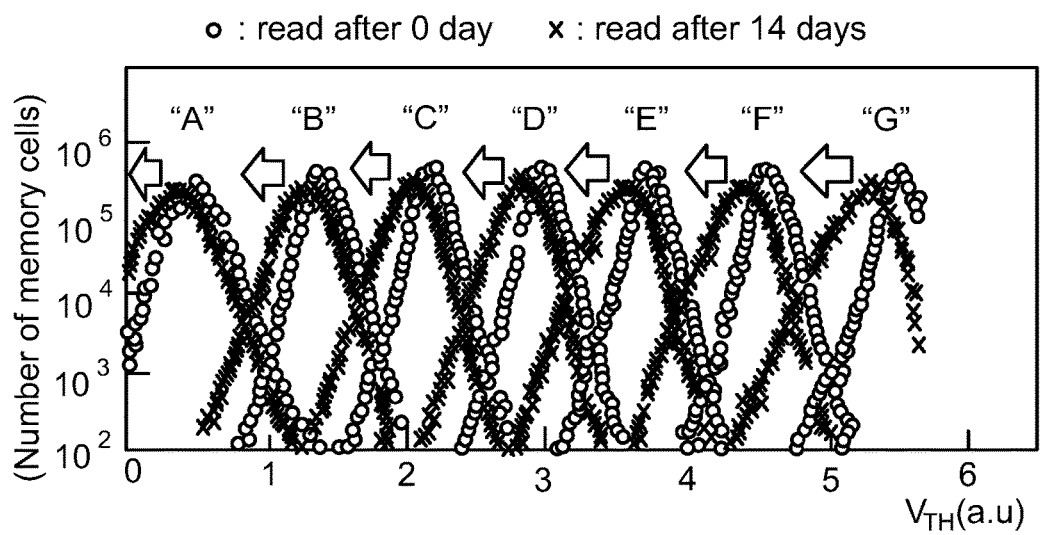

Please refer to the threshold voltage distribution curve of FIG. 3A. As the reading cycle of the read-hot data increases, the threshold voltage distribution curve corresponding to the storing state "Erase" is seriously shifted. In other words, the data error rate of the memory cells corresponding to the storing state "Erase" is the largest.

Figure 6A:
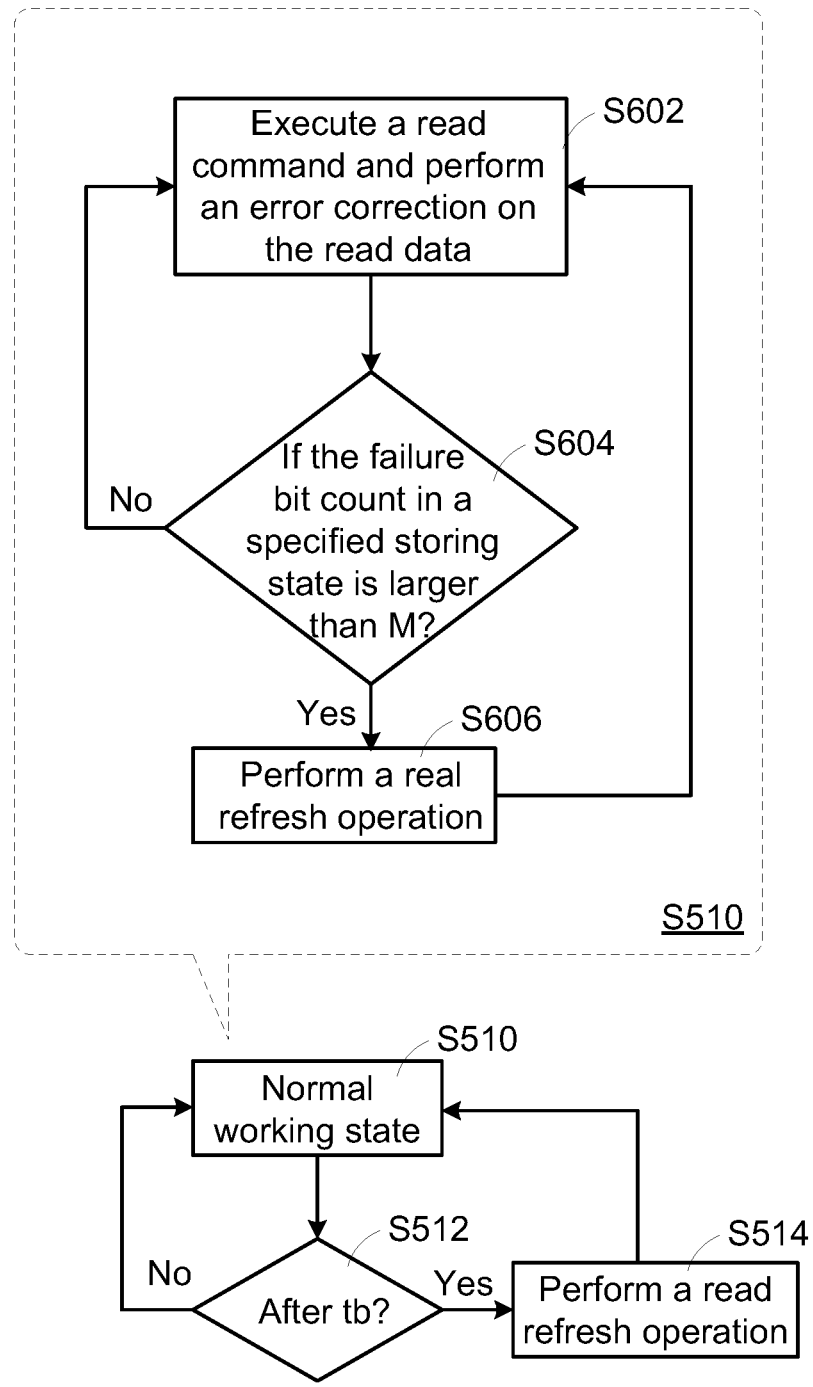
FIG. 6A is a flowchart illustrating a control method for a solid state storage device according to a third embodiment of the present invention.

FIG. 6A is a flowchart illustrating a control method for a solid state storage device according to a third embodiment of the present invention. The control method of this embodiment can solve the problems of the first embodiment and the second embodiment. The steps S510-S514 are similar to those of the first embodiment.

The features of this embodiment will be described as follows. If a read command for reading the read data of the memory cells of the specified region of the memory array 109 is transmitted from the host 14 to the solid state storage device 10 when the solid state storage device 10 is in the normal working state, the solid state storage device 10 outputs the read data and monitors the failure bit count corresponding to the storing state "Erase" of the read data. If the failure bit count corresponding to the storing state "Erase" is too large, it means that the threshold voltage distribution curve is seriously shifted.

In the step S602, the solid state storage device 10 executes a read command from the host 14 and performs an error correction on the read data. Consequently, the failure bit count of the read data in a specified storing state is realized. Then, a step S604 is performed to judge whether the failure bit count of the read data in a specified storing state is larger than a threshold value M. If the judging condition of the step S604 is not satisfied, the step S602 is repeatedly done and the solid state storage device 10 executes a next read command. Whereas, if the judging condition of the step S604 is satisfied, a real refresh operation is performed on the plural memory cells of the specified regions of the memory array 109 immediately (Step S606). Preferably, the specified storing state is the storing state "Erase".

In accordance with the present invention, the real refresh operation includes both of a read action and a write action. In an embodiment, while the real refresh operation is performed on the memory array 109, the data of the plural memory cells of the specified region are read out and then written into another region of the memory array 109. In another embodiment, when the real refresh operation is performed on the memory array 109, the data of the plural memory cells of the specified region are read out, erased, and then written into the specified region.

After the real refresh operation, the data written into the memory cells are not read-hot data. That is, the threshold voltage distribution curves of the memory cells storing these data are not shifted. Consequently, the accuracy of the read data is enhanced.

Figure 6B:
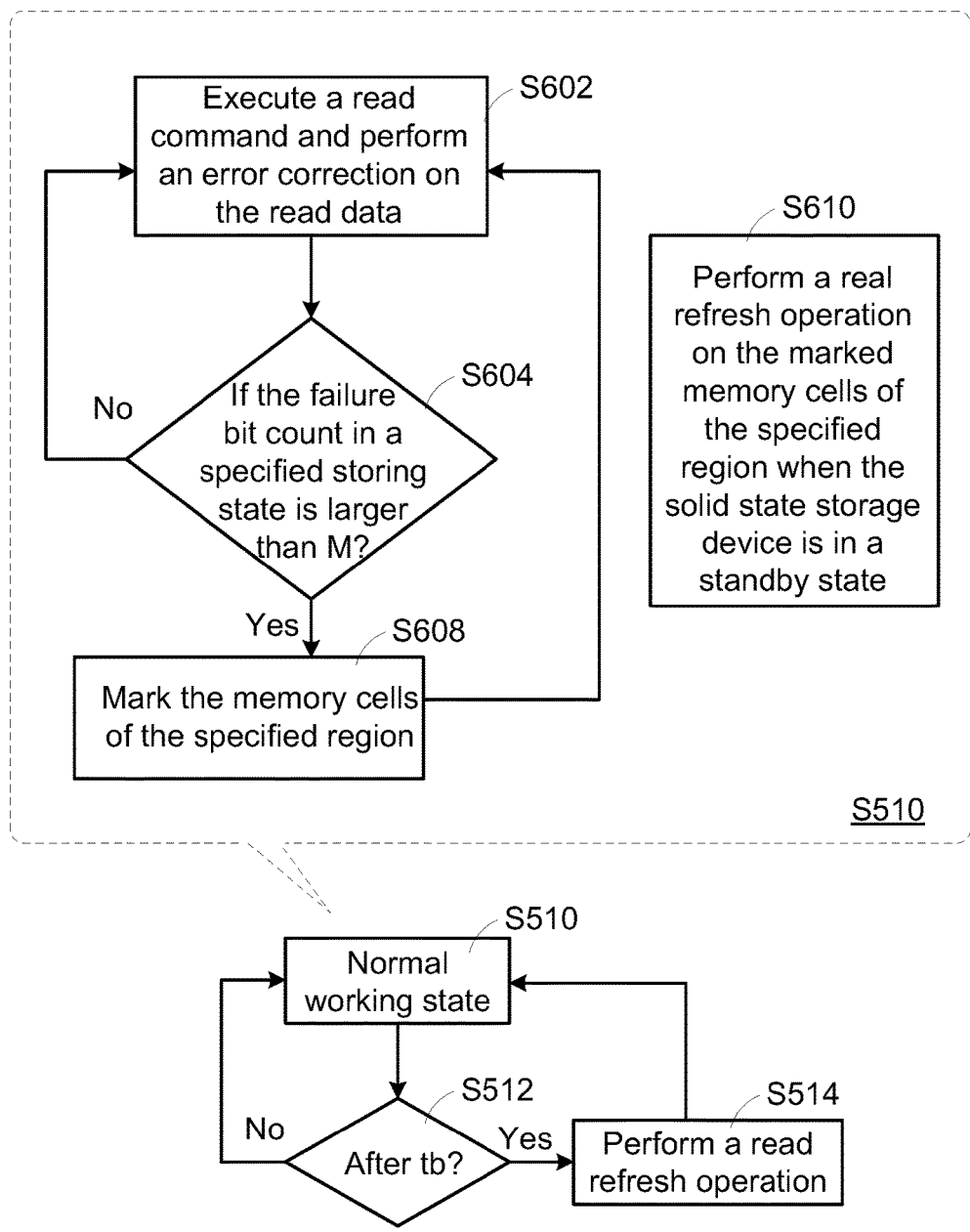
FIG. 6B is a flowchart illustrating a control method for a solid state storage device according to a fourth embodiment of the present invention.

FIG. 6B is a flowchart illustrating a control method for a solid state storage device according to a fourth embodiment of the present invention. The control method of this embodiment is similar to that of the third embodiment. Then, a step S604 is performed to judge whether the failure bit count of the read data in a specified storing state is larger than a threshold value M. If the judging condition of the step S604 is not satisfied, the step S602 is repeatedly done and the solid state storage device 10 executes a next read command. Whereas, if the judging condition of the step S604 is satisfied, the memory cells of the specified region are marked (Step S608). When the solid state storage device 10 is in a standby state without executing the command of the host, a real refresh operation is performed on the marked memory cells of the specified region of the memory array 109 (Step S610). Moreover, the data of the memory cells of the specified region are marked as invalid data. Hence, the performance of the solid state storage device 10 is enhanced.

In the third embodiment and the fourth embodiment, the specified storing state is the storing state "Erase". It is noted that the specified storing state is not restricted. That is, the solid state storage device 10 may monitor the failure bit count corresponding to any other storing state. For increasing the reliability of the solid state storage device 10, the control method of the third embodiment or the fourth embodiment may further comprise the initialization process (i.e., the steps S502, S504 and S506) as described in the second embodiment.

As the reading cycle of the read-hot data increases, the threshold voltage distribution curve corresponding to the storing state "Erase" is seriously shifted. In some other embodiments, the control method further comprises a process of judging whether the stored data of the memory cells are read-hot data or read-cold data by monitoring the failure bit count corresponding to any other storing state. Moreover, the solid state storage device 10 manages the read-hot data and the read-cold data in different management manners.

Figure 7:
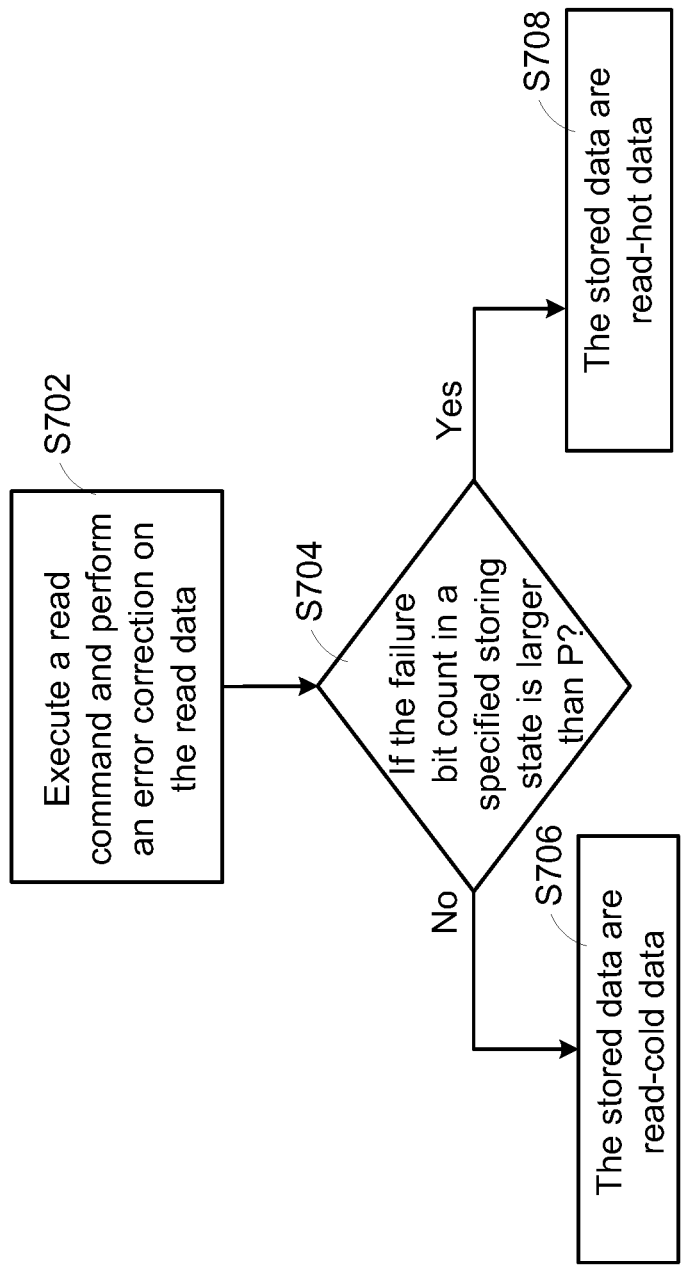
FIG. 7 is a flowchart illustrating a process of judging whether the stored data of the memory cells are read-hot data or read-cold data in the control method of the present invention.

FIG. 7 is a flowchart illustrating a process of judging whether the stored data of the memory cells are read-hot data or read-cold data in the control method of the present invention. This judging process is performed when the solid state storage device 10 is in the normal working state (i.e., in the step S510 of the above embodiments).

In the step S702, the solid state storage device 10 executes a read command from the host 14 and performs an error correction on the read data. Consequently, the failure bit count of the read data in a specified storing state is realized. Then, a step S704 is performed to judge whether the failure bit count of the read data in a specified storing state is larger than a threshold value P. If the judging condition of the step S704 is not satisfied, the stored data of the memory cells are read-cold data (Step S706). Whereas, if the judging condition of the step S704 is satisfied, it is judged that the stored data of the memory cells are read-hot data (Step S708).

Figure 2:
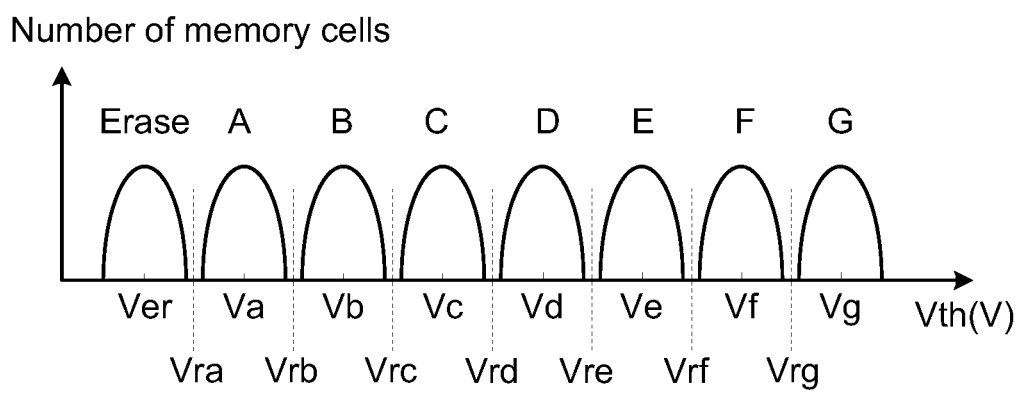
FIG. 2 (prior art) schematically illustrates the threshold voltage distribution curves of triple-level cells in different storing states.

After the step S706 or the step S708, the solid state storage device 10 further manages the read-hot data or the read-cold data. For example, as the reading cycle of the read-hot data increases, the threshold voltage distribution curves corresponding to the storing states "F" and "G" are shifted in the negative direction. When the memory cells storing the read-hot data in the storing states "F" and "G" are re-programmed, a program voltage higher than the preset program voltage is provided to these memory cells. Consequently, the medium threshold voltages are higher than the preset medium threshold voltages. After the program cycle, the medium threshold voltage Vf' corresponding to the storing state "F" and the medium threshold voltage Vg' corresponding to the storing state "G" are respectively higher than the medium threshold voltages Vf and Vg (see FIG. 2). That is, the possible shift amount is compensated in advance. Consequently, even if the read-hot data are read many times and the threshold voltage distribution curves are shifted, the read data can be accurately read out. As shown in FIG. 2, the medium threshold voltages Ver-Vg are uniformly distributed. Since the higher program voltage is only applied to the memory cells in the specified storing state according to the control method of the present invention, the medium threshold voltages Ver~Vg' are not uniformly distributed. That is, the medium threshold voltages Vf' and Vg' corresponding to the storing states "F" and "G" are shifted in the positive direction, and the possible shift amount is compensated in advance. Alternatively, the read-hot data are stored in a single-level cell (SLC) or a multi-level cell (MLC). The SLC can store only one bit of data per cell. The MLC can store two bits of data per cell. In comparison with the triple-level cell (TLC), the reliability of storing the read-hot data in the SLC or the MLC is enhanced. In an embodiment, the re-programming process is immediately performed after the solid state storage device 10 judges that the stored data of the memory cells are read-hot data. In another embodiment, the re-programming process is performed when the solid state storage device 10 is in the standby state.

From the above descriptions, the present invention provides a control method for a solid state storage device. The control method is applied to a memory array with a 3D configuration. The control method uses the firmware to monitor and control the 3D memory array without the need of modifying the hardware of the solid state storage device. Moreover, the timing of performing the read refresh operation or the real refresh operation is properly determined according to the present invention. Consequently, the accuracy of reading the stored data of the solid state storage device is effectively increased.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A control method for a solid state storage device, the control method comprising steps of:
    counting an elapsed time period of the solid state storage device when the solid state storage device is in a normal working state; and
    performing a read refresh operation on a memory array of the solid state storage device at a first time interval, wherein the read refresh operation is a dummy read action.

2. The control method as claimed in claim 1, further comprising steps of:
    performing the read refresh operation after the solid state storage device is powered on; and
    allowing the solid state storage device to be in the normal working state after the read refresh operation has been performed for a second time interval.

3. A control method for a solid state storage device, the control method comprising steps of:
    executing a read command from a host to read a read data from plural memory cells of a specified region of the memory array and counting an elapsed time period of the solid state storage device when the solid state storage device is in a normal working state;
    performing a read refresh operation on the memory array of the solid state storage device at a first time interval;
    performing an error correction to realize a failure bit count of the read data in a specified storing state; and
    if the failure bit count is larger than a first value, performing a real refresh operation on the memory cells of the specified region.

4. The control method as claimed in claim 3, further comprising a step of:
    performing the real refresh operation on the memory cells of the specified region immediately; or
    marking the memory cells of the specified region, and performing the real refresh operation on the marked memory cells of the specified region when the solid state storage device is in a standby state.

5. The control method as claimed in claim 4, wherein while the real refresh operation is performed, the read data stored in the specified region is written into plural memory cells of another region of the memory array.

6. The control method as claimed in claim 4, wherein while the real refresh operation is performed, the read data stored in the memory cells of the specified region is erased and then the read data is written into the memory cells of the specified region.

7. A control method for a solid state storage device, the control method comprising steps of:
    executing a read command from a host to read a read data from plural memory cells of a specified region of a memory array when the solid state storage device is in a normal working state;
    performing an error correction to realize a failure bit count of the read data in a specified storing state; and
    if the failure bit count is larger than a first value, performing a real refresh operation on the memory cells of the specified region immediately; or
    marking the memory cells of the specified region, and performing the real refresh operation on the marked memory cells of the specified region when the solid state storage device is in a standby state.

8. The control method as claimed in claim 7, wherein while the real refresh operation is performed, the read data stored in the specified region is written into plural memory cells of another region of the memory array.

9. The control method as claimed in claim 7, wherein while the real refresh operation is performed, the read data stored in the memory cells of the specified region is erased and then the read data is written into the memory cells of the specified region.

10. A control method for a solid state storage device, the control method comprising steps of:
    executing a read command from a host to read a read data from plural memory cells of a specified region of a memory array when the solid state storage device is in a normal working state;
    performing an error correction to realize a failure bit count of the read data in a specified storing state;
    if the failure bit count is larger than a first value, judging that the memory cells of the specified region store read-hot data; and
    if the failure bit count is not larger than the first value, judging that the memory cells of the specified region store read-cold data.

11. The control method as claimed in claim 10, wherein during a program cycle, a program voltage higher than a preset program voltage is provided to the memory cells that store the read-hot data in a specified storing state, so that a medium threshold voltage corresponding to the specified storing state is higher than a preset medium threshold voltage.

12. The control method as claimed in claim 10, wherein one bit of the read-hot data is stored in each of the memory cells, or two bits of the read-hot data are stored in each of the memory cells.

* * * * *